United States Patent
Plettemeier et al.

(10) Patent No.: US 9,059,503 B2
(45) Date of Patent: Jun. 16, 2015

(54) ANTENNA ARRANGEMENT FOR TRANSMITTING SIGNALS

(75) Inventors: Dirk Plettemeier, Dresden (DE); Michael Jenning, Dresden (DE); Ting-Jung Liang, Dresden (DE)

(73) Assignee: TECHNISCHE UNIVERSITAT DRESDEN, Dresden (DE)

( * ) Notice: Subject to any disclaimer, the term of this patent is extended or adjusted under 35 U.S.C. 154(b) by 569 days.

(21) Appl. No.: 13/504,255

(22) PCT Filed: Oct. 29, 2010

(86) PCT No.: PCT/EP2010/066485
§ 371 (c)(1), (2), (4) Date: Sep. 20, 2012

(87) PCT Pub. No.: WO2011/051456
PCT Pub. Date: May 5, 2011

(65) Prior Publication Data
US 2013/0009848 A1 Jan. 10, 2013

(30) Foreign Application Priority Data
Oct. 29, 2009 (DE) .......... 10 2009 051 143

(51) Int. Cl.
*H01Q 21/00* (2006.01)
*H01Q 1/22* (2006.01)
*H01L 23/66* (2006.01)
*H01Q 21/06* (2006.01)

(52) U.S. Cl.
CPC .............. *H01Q 1/2283* (2013.01); *H01L 23/66* (2013.01); *H01L 2223/6677* (2013.01); *H01Q 21/06* (2013.01); *H01L 2924/0002* (2013.01)

(58) Field of Classification Search
USPC ........................... 343/767, 893; 257/659, 679
See application file for complete search history.

(56) References Cited

U.S. PATENT DOCUMENTS

| | | | |
|---|---|---|---|
| 5,903,239 A * | 5/1999 | Takahashi et al. | 343/700 MS |
| 6,373,447 B1 | 4/2002 | Rostoker | |
| 7,221,052 B2 | 5/2007 | Huang et al. | |
| 2005/0093145 A1 | 5/2005 | Briancon et al. | |
| 2009/0207090 A1 | 8/2009 | Pettus et al. | |
| 2009/0256752 A1* | 10/2009 | Akkermans et al. | 343/700 MS |
| 2013/0050016 A1* | 2/2013 | Kim et al. | 342/195 |
| 2014/0145883 A1* | 5/2014 | Baks et al. | 343/700 MS |

FOREIGN PATENT DOCUMENTS

| | | |
|---|---|---|
| EP | 2071663 A1 | 6/2009 |
| WO | 2007149819 A2 | 12/2007 |
| WO | 2008030208 A2 | 3/2008 |

OTHER PUBLICATIONS

International Search Report for PCT/EP2010/066485 dated Feb. 15, 2011.

* cited by examiner

*Primary Examiner* — Tan Ho
(74) *Attorney, Agent, or Firm* — Heslin Rothenberg Farley & Mesiti P.C.

(57) ABSTRACT

An antenna arrangement for transmitting signals has improved directional characteristics and a higher antenna gain, is simple to produce, and is robust and cost-effective. The antenna arrangement has a plurality of planes, and a plurality of individual antennas are arranged in each plane.

20 Claims, 4 Drawing Sheets

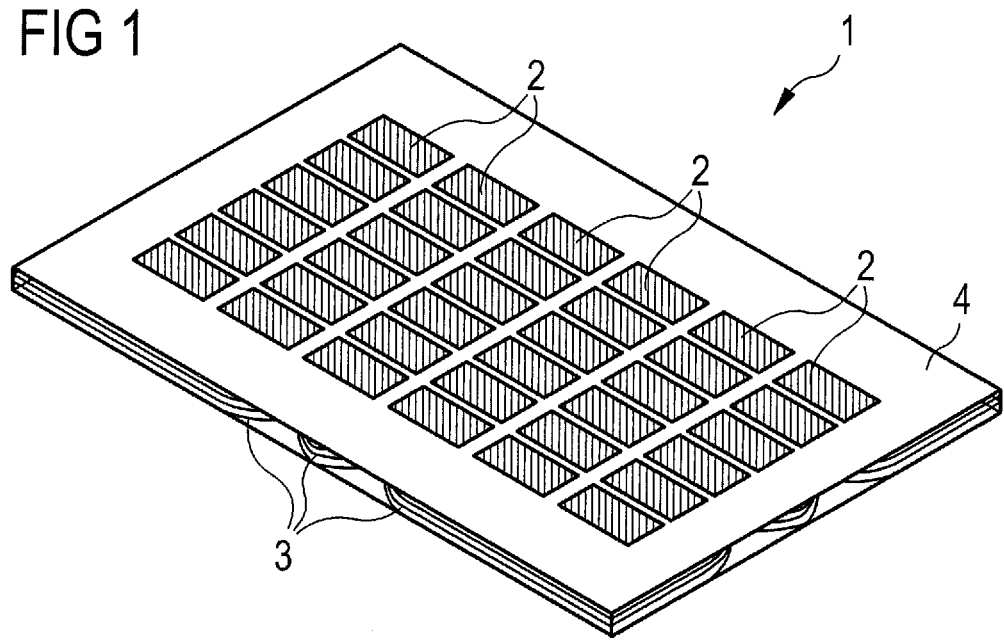
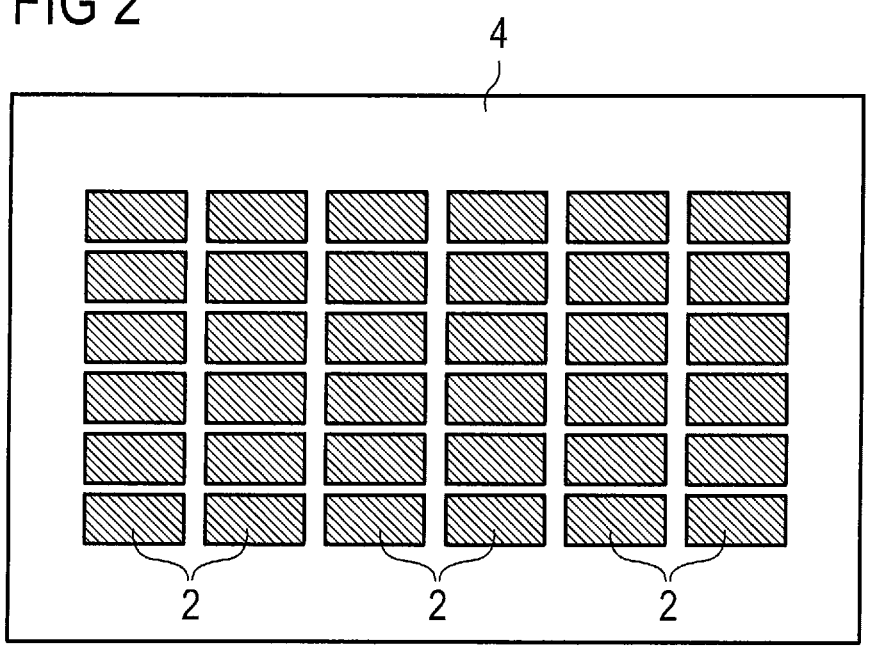

ANTENNA ARRANGEMENT FOR TRANSMITTING SIGNALS

CROSS REFERENCE TO RELATED APPLICATIONS

This application is a 371 filing of international application PCT/EP2010/066485 filed on Oct. 29, 2010 and published in German as WO 2011/051456 A1 on May 5, 2011, and claims priority of German Application No. 10 2009 051 143.1 filed on Oct. 29, 2009, the entire contents of these applications being hereby incorporated by reference herein.

BACKGROUND ART

The invention relates to an antenna arrangement for transmitting signals, consisting of a plurality of antennas, which are arranged in a plane spaced from a chip surface.

Antennas are required for emitting and receiving electromagnetic waves, for example, in the field of wireless communication. This technical arrangement as an antenna arranged on the sender side converts conducted electromagnetic waves into so-called free-space waves, which propagate as electromagnetic waves from the antenna into space.

On the receiver side, the antenna converts the electromagnetic waves arriving as a free-space wave back into conducted electromagnetic waves; the antenna therefore is a converter between conducted and free-space waves and vice versa. The matching of the wave impedance of the line to the wave impedance of the free space is essential for this.

In modern devices within the field of communication technology, there is the need to connect antennas having small or the smallest dimensions to the semiconductor chips provided for signal processing or to components of the semiconductor chip, to assure the functionality thereof.

U.S. Pat. No. 7,221,052 B2 discloses an antenna connected to a semiconductor chip, the antenna being formed on the upper surface of the semiconductor chip.

This solution has the disadvantage that it is part of the chip itself. As a result, use with different chips is possible only to a limited extent, because the designing of the antenna structure must be carried out during the designing of the chip.

U.S. Pat. Appl. No. 2009/0207090 discloses an antenna arrangement, arranged on the top surface of a semiconductor chip and consisting of four antennas having the same structure. This arrangement improves the potential applications, because it is independent of the chip and therefore can be used for a plurality of different chips. The disadvantages of said arrangement are that the chips are in the same location as the antenna elements. This results in an increase in the area required on a circuit board by the entire structural part, consisting of an antenna, chip, and housing. Another disadvantage of said arrangement is that the chips affect the radiation pattern of the antennas and the radiated power has an effect on the chip.

The object of the invention therefore is to provide an antenna arrangement for transmitting signals, said arrangement having improved directional characteristics and a higher antenna gain, is simple to produce, and is robust and cost-effective.

BRIEF SUMMARY OF THE INVENTION

According to the invention, the object is attained by an antenna arrangement for transmitting signals of the aforementioned type in that the antenna arrangement has a plurality of planes, whereby a plurality of individual antennas are arranged in each plane.

According to the invention, a plurality of antennas per plane are arranged, whereby the antenna arrangement comprises at least two planes. The directional characteristics are improved by such an arrangement of the antennas to form an antenna arrangement.

The invention makes possible a combination of both similar and different antennas in an antenna system, in order to improve the performance of the overall system. In this regard, the improvements comprise the increase in the coverage of the space that can be illuminated, whereby the individual antenna systems are not negatively influenced in general, and the reduction of energy consumption.

Major advantages here are the increase in coverage, i.e., the space which the overall antenna system is capable of illuminating (emission characteristics), and the compact and robust structural form.

In a design of the invention, it is provided that the orientation of the antennas in a plane is the same.

In a version of the invention, it is provided that the orientation of the antennas in a plane is different.

The individual antennas arranged in a plane of the antenna arrangement can be arranged oriented similarly in the main direction of their emitted radiant intensity. A directivity of the antenna arrangement in a preferred radiation direction of the antennas can be achieved in such a way.

In another version, the individual antennas of a plane can be oriented differently with regard to their main direction. By means of the different main directions, the directional characteristics of the antenna arrangement can be changed in such a way, for example, that a preferred region or sector of the directivity or a virtually uniform directivity (spherical characteristics) on all sides results.

An embodiment of the invention provides that the orientation of the antennas between two adjacent planes is the same.

It is provided in another design of the invention that the orientation of the antennas between two adjacent planes is different.

According to the invention, it is possible to design the orientation of the individual antennas of one plane as the same or different to the orientation of the individual antennas of another plane. In the case of an identical orientation between two planes, the directivity of the entire antenna arrangement improves in turn in the direction of the orientation of the individual antennas, whereas a preferred region or a more uniform omnidirectional directivity can be achieved by means of a different orientation of the planes.

It is provided in a particular version of the invention that the antennas of two adjacent planes are arranged congruent or offset relative to one another.

If a plurality of planes of the antenna arrangement have a planar structure, the planes can thus be arranged as multiple layers one above the other. In so doing, it is possible to arrange the individual planes flush or offset to one another, whereby the directional characteristics of the system can be influenced in turn.

In a version of the invention, it is provided that the planes have a circular or n-cornered base area with $n \geq 3$.

It is possible to vary the base area of one or more planes; thus it can be formed, for example, as a triangle, tetragon, or octagon.

In another version of the invention, it is provided that the planes are arranged one above the other, forming a cuboid or a pyramid frustum structure.

In the case of a rectangular base area of a plane of the antenna arrangement, in an arrangement of the planes on or above one another, either a cuboid structure arises or for the case that the dimensions of the planes arranged one above the other become increasingly smaller, a pyramid frustum structure.

In a special version of the invention, it is provided that the coupling of the antenna arrangement to the chip occurs by means of contacts, inductively, or capacitively.

To transmit signals between the individual antennas or the antenna arrangement and the chip, both must be connected to one another. Signal transmission between chip and antenna can occur, for example, through an electrically conductive connection in the form of contacts or wires. Another form of connection is a capacitive or inductive coupling between the antenna and chip.

In a special embodiment of the invention, it is provided that the antenna arrangement is arranged indirectly on the chip or in a housing part covering the chip like a cover.

The invention in a special version provides a housing for a chip, which contains simultaneously an antenna arrangement of the invention. In this regard, several possibilities are conceivable for the design of this antenna arrangement, for example, combinations of two or more similar or different antennas (for example, microstrip patch antennas, Vivaldi antennas) in one or more planes. An arrangement of a plurality of antennas in each case in at least two different planes to form an antenna system is also possible. In the combination of different antennas to form an antenna arrangement of this type, a goal is to enlarge the so-called illuminated area or the directional characteristics of the antenna.

In a version of the invention, it is provided that each antenna is connected to a separate control unit or that a plurality of antennas are connected to a common control unit.

According to the invention, each individual antenna of the antenna arrangement can be connected to its own control unit. Here, an individual antenna becomes active at an established time, controlled by its assigned control unit.

Another option is to interconnect a plurality of antennas of one or more planes of the antenna arrangement and to connect them to a control unit. Thus, a plurality of antennas interconnected in such a way, which are also called a cluster, are controlled by a common control circuit.

The number of required amplifiers can be reduced and thereby the system power requirement can be decreased by the interconnection of a plurality of individual antennas of the antenna arrangement.

This interconnection of a plurality of antennas can occur randomly. In so doing, for example, connections established at the outset, which are to be switched, are created between the control circuit and the antennas. As a result, the antenna arrangement or a part of the antenna arrangement (cluster) becomes active at an established time.

A totally dynamic operating mode is also possible, however, in such a way that the electrical amplitudes and phases of all antennas and/or clusters are controlled simultaneously and independently of one another by means of a suitable control unit.

BRIEF DESCRIPTION OF THE DRAWING FIGURES

The invention will be illustrated below in greater detail with use of an exemplary embodiment: In the associated drawings, FIG. 1 shows a view of an antenna arrangement of the invention with two antenna sub-arrangements, arranged one above the other;

FIG. 2 shows a view of the first antenna sub-arrangement from above;

DETAILED DESCRIPTION

Figure 3:
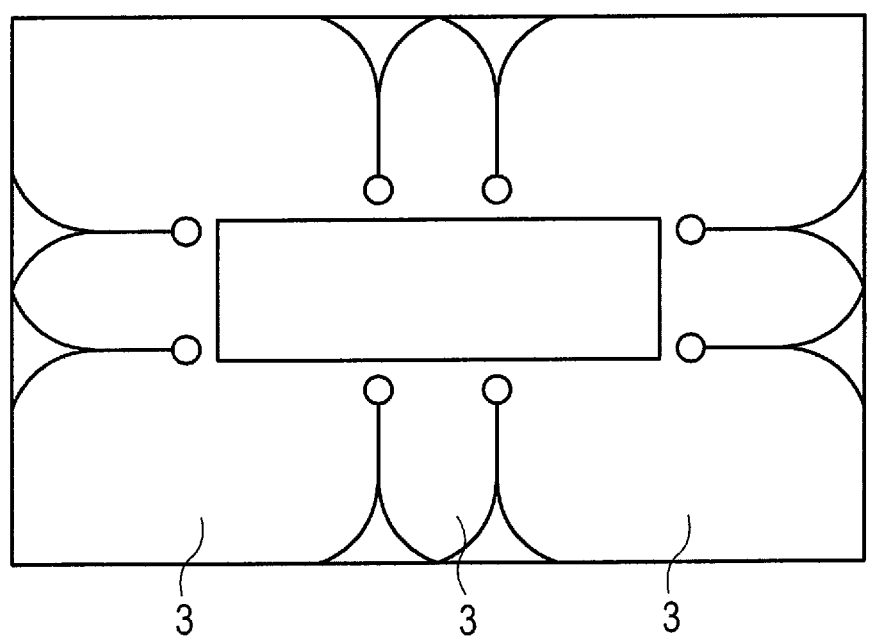
FIG. 3 shows a view of the second antenna sub-arrangement.

FIG. 1 shows an antenna arrangement 1 of the invention, which, for example, is arranged in a chip housing part 4, covering a chip like a cover. Chip housing 4 is shown only in part and only schematically.

FIG. 1 shows antenna arrangement 1 in an isometric view. Antenna arrangement 1 consists of two antenna sub-arrangements 2 and 3. The first antenna sub-arrangement 2 comprises the topmost plane. A plurality of individual antennas arranged in a plurality of rows and columns are shown in this plane. In the example, 36 units are shown each in a rectangular form. In this version of the invention, the antennas of the topmost plane are made as microstrip patch antennas and arranged oriented identically.

Second antenna sub-arrangement 3 is shown under first antenna sub-arrangement 2. Antenna sub-arrangement 3 comprises two planes, in which in each case a plurality of Vivaldi antennas per plane are arranged oriented in different directions.

The orientation of the Vivaldi antennas between the two adjacent planes is congruent. It is also conceivable, however, to make second antenna sub-arrangement 3 as consisting only of one plane or of three planes, whereby the orientation of the Vivaldi antennas is different from plane to plane. It is possible, further, according to the invention to arrange both Vivaldi antennas and microstrip patch antennas in one plane.

FIG. 2 shows a view of the antenna arrangement from above onto chip housing 4, whereby a housing layer or protective layer covering the topmost plane is not shown.

The antenna arrangement in a view from below is shown in FIG. 3. Antenna sub-arrangement 3, consisting of a plurality of Vivaldi antennas, extends in this case to the edge of chip housing 4. The orientation of the Vivaldi antennas occurred in a plane of a coordination system (not shown) at an angle of 0, 90, 180, and 270 degrees.

Figure 4:
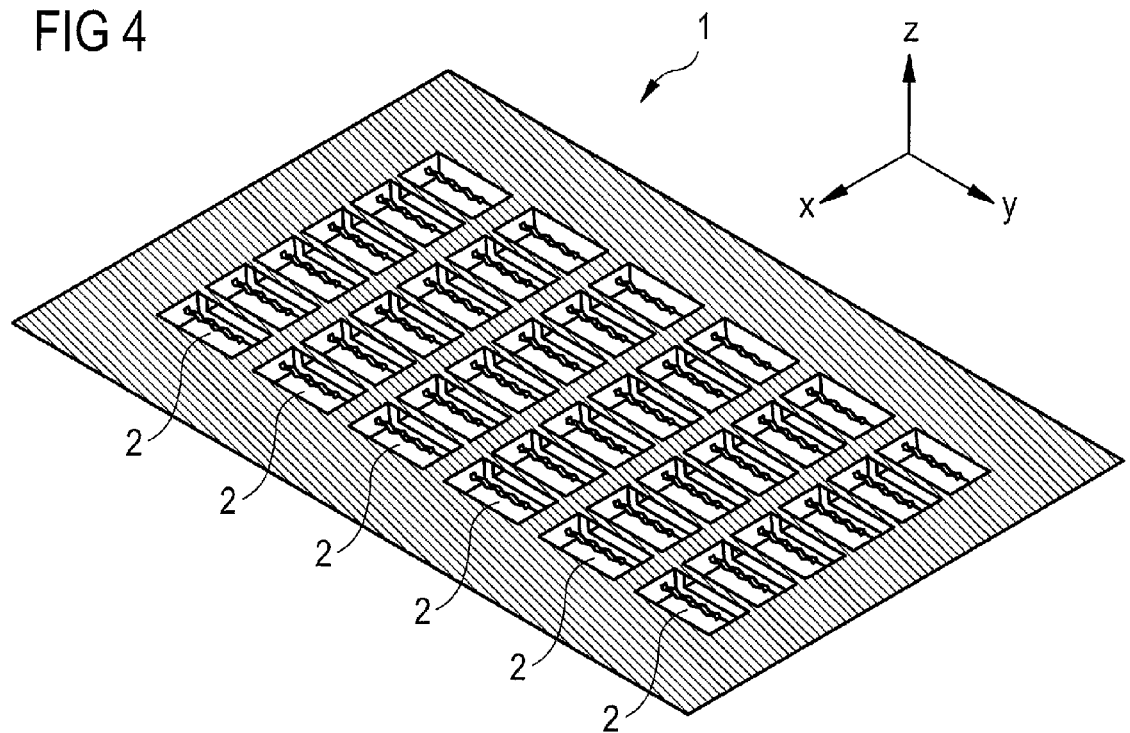
FIG. 4 shows a representation of an antenna arrangement, consisting of 6×6 antenna elements, sub-antennas, or individual antenna elements, cavity-backed dipole antennas being used here.

FIG. 4 shows a representation of a 6×6 antenna array, for example, as first antenna sub-arrangement 2, in which so-called "cavity-backed dipole antennas" were used. The orientation of all antennas of this antenna sub-arrangement 2 is the same.

Figure 5:
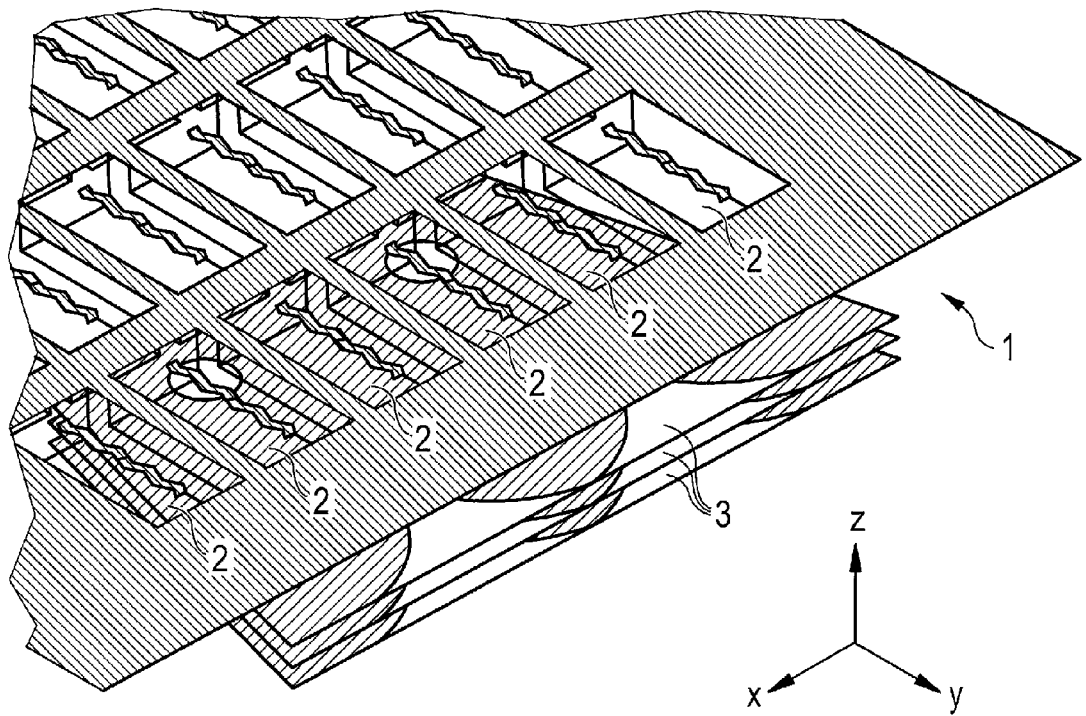
FIG. 5 shows a detail enlargement of a 6×6 array from FIG. 4 with Vivaldi antennas, arranged below and made as triple layers.

FIG. 5 shows a detail enlargement of the first antenna sub-arrangement 2, consisting of a plane, of FIG. 4. A second antenna sub-arrangement 3, consisting of three planes, is arranged below first antenna sub-arrangement 2. In this plane, Vivaldi antennas are oriented identically and arranged congruently one above the other.

Figure 6:
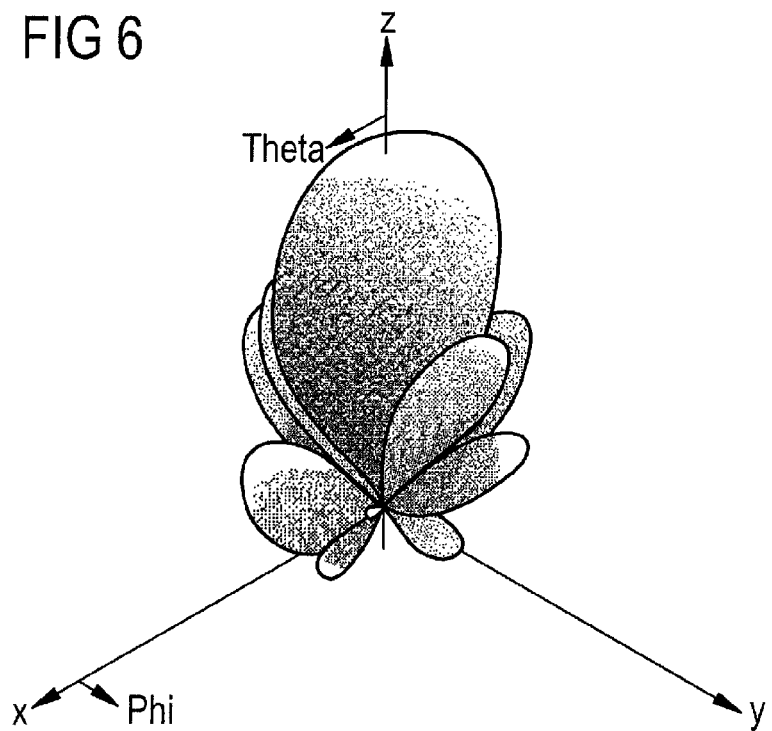
FIG. 6 shows the directional characteristics of the array of FIG. 4, where all elements are in-phase and supplied with the same amplitude.
Figure 7:
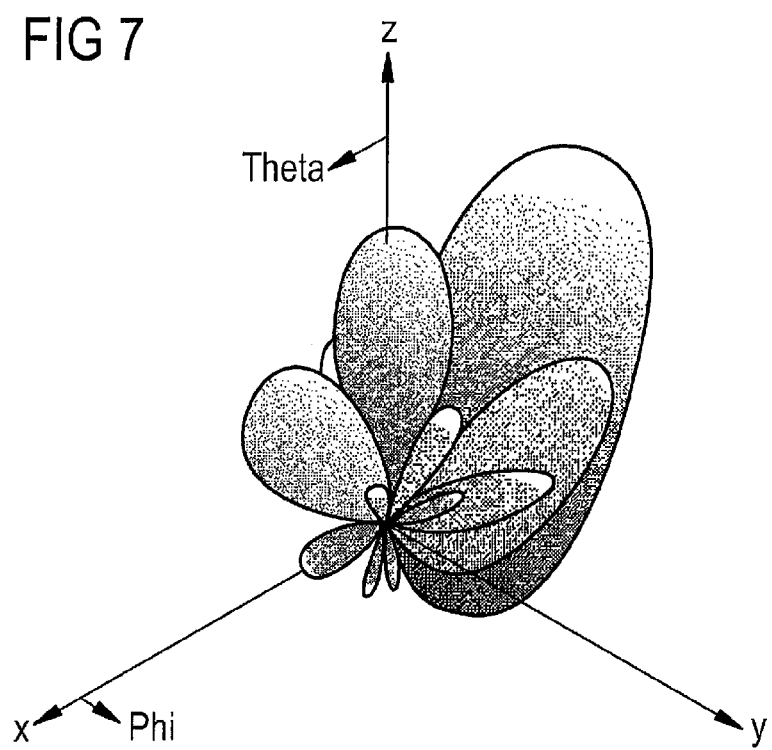
FIG. 7 shows the directional characteristics of the array of FIG. 4; here the phases of the individual elements were set so that beam steering is achieved.

FIG. 6 shows a three-dimensional graphic representation of the radiation pattern (or directional characteristics) of antenna arrangement 1 of the invention of FIG. 4. The representation is merely a basic diagram of different lobes in a spatial coordinate system. A depiction of the field strength was omitted. Shown is the case of an in-phase antenna arrangement 1 consisting of 36 sub-antennas supplied with the same amplitude.

Another three-dimensional basic diagram of directional characteristics is shown in FIG. 6. It also relates to antenna arrangement 1 shown in FIG. 4. In this case, the phases of the 36 individual antennas of antenna arrangement 1 were set in such a way that the shown beam steering is achieved. The maximum achievable beam steering with an arrangement of this type is shown in FIG. 6. Another beam steering is possible by means of an antenna arrangement 1 shown in FIG. 5. Two antenna sub-arrangements 2 and 3 consisting of different antennas are shown here. A selective effect on the beamforming and the orientation is achieved by means of the different types of antennas and a different orientation of the antennas in a plane or between the planes.

The invention provides an antenna arrangement 1, which is arranged directly in the housing of a chip 4, preferably in a housing part covering the chip like a cover.

Such chips can be, for example, semiconductor chips for applications in the millimeter wave range. In so doing, it is immaterial for the antennas of antenna arrangement 1 which signal information is emitted or received by it.

If antenna arrangement 1 is part of the chip housing, there is no need for connections between the terminals of the semiconductor chip (pins) and a separate antenna, arranged outside of the chip, which leads to a simplification of the chip design and a reduction of costs. Further, no electrical losses occur due to the aforementioned connections. Thus, a reduction of power dissipation is achieved. Moreover, the number of necessary connection lines on the board with the chip is reduced, which leads to a reduction of the necessary space requirement and cost.

Antenna arrangement 1 of the invention, however, can also be applied directly on the chip, for example, only separated from it by an insulation layer, and thus does not form part of the chip housing.

Another possibility for placing antenna arrangement 1 is the arrangement directly on the semiconductor chip as a sub-assembly of the chip itself or placement in a chip housing wall covering the semiconductor chip on the side.

Such antenna arrangements 1 can be used, for example, for transmitting large amounts of data between PC, printer, mouse, keyboard, screen, TV device, hi-fi devices, video projectors, analytical medical devices, etc. In this regard, for example, during use of the 60 GHz frequency spectrum, data transmission is possible up to a distance of about 10 meters.

Other special features and embodiments of the invention are listed below:

Combinations of two (or more) different antenna arrangements, e.g., planar, coated systems, are possible. An increase in the illuminated space (increase in coverage) and a compact structural form of the antenna arrangement are achieved as a result.

Integration of the antenna arrangement into the chip housing or implementation of the invention on the chip itself is possible.

Use of one or more multilayer antenna arrangements is possible, whereby the number of layers is ≥1.

The supply network for controlling the individual antennas is located within the housing itself. In this case, it can also be made multilayer. Possible line structures are CPS, CPW, (coupled) microstrips, slotline, or stripline. The cross-coupling of the feed lines to the radiating apertures can occur in different ways, e.g., coupled galvanically, capacitively, or inductively.

Galvanic, capacitive, or inductive connections between the housing and chip are provided.

The following implementations are provided for the control of the individual antennas of antenna arrangement 1:
  Hard-wired, i.e., no beam steering is possible.
  Completely independent, i.e., the electrical phases and amplitudes of each antenna element of all antenna systems can be adjusted freely and independently of one another.
  A combination of the aforementioned possibilities, i.e., rather small groups (clusters), consisting of hard-wired antenna elements of one or more antenna systems are formed, whereby the electrical phases and amplitudes of the individual groups can be adjusted independently of one another.
  Individual antenna elements or clusters can be connected/disconnected or activation can be combined as desired to achieve a discretized beam steering.
  The power of the individual power amplifiers can be divided and combined as desired among the antenna elements or clusters. This also applies to the receiver amplifiers.
  Beamforming and beam steering may concern merely a control or regulation as well, which can be realized adaptively.

According to the invention, the antenna types listed below may be used:
  In an antenna arrangement according to FIG. 1:
    Patch antennas
    Dielectric resonator antennas
    Loop antennas, rhombic antennas
    "Printed" dipoles, Yagi antennas
    Cavity-backed structures
    Vias indicated as horn antennas in the topmost substrate layer with feed elements (cf. U.S. Pat. No. 7,444,734 B2)
  In an antenna arrangement according to FIG. 3:
    Widened slot antennas (possible forms of the widening: stepwise, linear, exponential (Vivaldi antenna), etc.)
    Dipoles
    Yagi antennas
    Laterally mounted patch antennas
    Dielectric resonator antennas mounted beside the housing/glued to the housing (or attached in some other manner)
  Practical combinations of multilayer partial antenna systems may consist of:
    Patch antennas (on top) with Vivaldis (multilayer)
    Patch antennas (on top) with a series of patch antennas on the side
    Loop antennas (on top) with Vivaldis (multilayer)

Such an antenna arrangement can be used, for example, in the field of communication (high data rates, short contact times), sensor technology (high resolution), medicine (e.g., imaging systems), radar, pattern recognition, and in industrial manufacturing.

The invention claimed is:

1. An antenna arrangement for transmitting signals to and/or from a semiconductor chip, comprising a first sub-arrangement of individual antennas arranged in a first plane spaced from an outer surface of the semiconductor chip, and a second sub-arrangement of individual antennas arranged in one or more other planes, with a plurality of individual antennas arranged in each of said one or more other planes, wherein each antenna is connected to a separate control unit or some of the individual antennas are interconnected in a cluster controlled by a common control unit, and wherein electrical amplitudes and phases of all individual antennas and/or clusters are controlled simultaneously and independently of one another in a dynamic operating mode.

2. The antenna arrangement according to claim 1, wherein orientation of the antennas in a plane is the same.

3. The antenna arrangement according to claim 1, wherein orientation of the antennas in a plane is different.

4. The antenna arrangement according to claim 1, wherein orientation of the antennas between two adjacent planes is the same.

5. The antenna arrangement according to claim 1, wherein orientation of the antennas between two adjacent planes is different.

6. The antenna arrangement according to claim 1, wherein antennas of two adjacent planes are arranged congruent or offset to one another.

7. The antenna arrangement according to claim 1, wherein the planes have a circular or n-cornered base area with n≥3.

8. The antenna arrangement according to claim 1, wherein the planes are arranged one above the other, forming a cuboid or a pyramid frustum structure.

9. The antenna arrangement according to claim 1, wherein the coupling of the antenna arrangement to the chip occurs by contacts, inductively, or capacitively.

10. The antenna arrangement according to claim 1, wherein the antenna arrangement is arranged indirectly on the chip or in a housing part covering the chip like a cover.

11. The antenna arrangement according to claim 1, wherein the antenna arrangement and a supply network for controlling the individual antennas and/or clusters are located in a common housing for the semiconductor chip.

12. The antenna arrangement according to claim 1, wherein at least two of the individual antennas are of different types.

13. The antenna arrangement according to claim 12, wherein the at least two individual antennas of different types are in a same plane.

14. The antenna arrangement according to claim 12, wherein the different types include a patch antenna and a vivaldi antenna.

15. The antenna arrangement according to claim 12, wherein the different types include a cavity-backed dipole antenna, and a vivaldi antenna.

16. The antenna arrangement according to claim 1, wherein at least one of the individual antennas of the second sub-arrangement comprises a vivaldi antenna.

17. The antenna arrangement according to claim 1, wherein the first sub-arrangement comprises patch antennas or loop antennas, and the second sub-arrangement comprises vivaldi antennas.

18. The antenna arrangement according to claim 1, wherein the first sub-arrangement is located above the semiconductor chip, and the second sub-arrangement is located along a side of the semiconductor chip.

19. The antenna arrangement according to claim 1, wherein the individual antennas of the first sub-arrangement are selected from the group consisting of: patch antennas, dielectric resonator antennas, loop antennas, rhombic antennas, printed dipoles, yagi antennas, cavity-backed structures and vias serving as horn antennas.

20. The antenna arrangement according to claim 19, wherein the individual antennas of the second sub-arrangement are selected from the group consisting of: widened slot antennas, vivaldi antennas, dipoles, yagi antennas, laterally mounted patch antennas, and dielectric resonator antennas.

* * * * *